(12) United States Patent
Lue

(10) Patent No.: US 8,026,179 B2
(45) Date of Patent: Sep. 27, 2011

(54) PATTERNING METHOD AND INTEGRATED CIRCUIT STRUCTURE

(75) Inventor: Hang-Ting Lue, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 55 days.

(21) Appl. No.: 12/421,071

(22) Filed: Apr. 9, 2009

(65) Prior Publication Data
US 2010/0258913 A1  Oct. 14, 2010

(51) Int. Cl.
*H01L 21/311* (2006.01)
(52) U.S. Cl. .. 438/703; 438/696; 438/717; 257/E21.023
(58) Field of Classification Search .................. 257/618; 438/703
See application file for complete search history.

(56) References Cited

U.S. PATENT DOCUMENTS

| | | | |
|---|---|---|---|
| 2006/0273456 A1* | 12/2006 | Sant et al. | 257/734 |
| 2007/0077524 A1* | 4/2007 | Koh et al. | 430/314 |
| 2008/0090418 A1* | 4/2008 | Jeon et al. | 438/689 |

FOREIGN PATENT DOCUMENTS

EP  1357433 A2 * 10/2003

* cited by examiner

*Primary Examiner* — Ajay K Arora
(74) *Attorney, Agent, or Firm* — J.C. Patents

(57) ABSTRACT

A patterning method is provided. First, a mask layer and a plurality of first transfer patterns are sequentially formed on a target layer. Thereafter, a plurality of second patterns is formed in the gaps between the first transfer patterns. Afterwards, a plurality of third transfer patterns is formed, wherein each of the third transfer patterns is in a gap between a first transfer pattern and a second transfer pattern adjacent to the first transfer pattern. A portion of the mask layer is then removed, using the first transfer patterns, the second transfer patterns and third transfer patterns as a mask, so as to form a patterned mask layer. Further, a portion of the target layer is removed using the patterned mask layer as a mask.

20 Claims, 9 Drawing Sheets

PATTERNING METHOD AND INTEGRATED CIRCUIT STRUCTURE

BACKGROUND OF THE INVENTION

1. Field of Invention

The present invention relates to a patterning method and an integrated circuit structure.

2. Description of Related Art

Non-volatile memories provide the property of multiple entries, retrievals and erasures of data, and are able to retain the stored information even when the electrical power is off. As a result, non-volatile memories are widely used in personal computers and consumer electronic products.

As the level of integration of a non-volatile memory is getting higher, the critical dimension of the same is getting smaller. Minimizing the critical dimension and increasing the level of integration have become the mainstream in the industry, and the key technology is in photolithography.

In the photolithography process, it is known that raising a line or space resolution beyond 65 nm, especially a line/space width of no more than 25/25 nm, in the current state of technology is rather difficult, unless a light source having a shorter wavelength and a corresponding photoresist are used. However, it is very costly to replace existing machines entirely with new machines for this purpose.

Accordingly, how to reduce a line/space width to no more than 25/25 nm with existing machines and processes has become an important topic in the industry.

SUMMARY OF THE INVENTION

The present invention provides a patterning method, with which the purpose of reducing a line/space width to no more than 25/25 nm is easily achieved.

The present invention further provides a patterning method, with which the defined pattern density is increased by 4 times and the pitch is reduced to ¼ that of its original length.

The present invention provides a patterning method. First, a mask layer and a plurality of first transfer patterns are sequentially formed on a target layer. Thereafter, a first conversion process is performed to surfaces of the first transfer patterns, so as to form a plurality of first conversion patterns on the surfaces of the first transfer patterns. Afterwards, a plurality of second transfer patterns is filled in gaps between the first conversion patterns. The first conversion patterns are then removed. Further, a second conversion process is performed to surfaces of the first transfer patterns and the second transfer patterns, so as to form a plurality of second conversion patterns on the surfaces of the first transfer patterns and the second transfer patterns. Next, a plurality of third transfer patterns is filled in gaps between the second conversion patterns. Thereafter, the second conversion patterns are removed. Afterwards, a portion of the mask layer is removed, using the first transfer patterns, the second transfer patterns and the third transfer patterns as a mask, so as to form a patterned mask layer. A portion of the target layer is then removed using the patterned mask layer as a mask.

According to an embodiment of the present invention, the target layer is a substrate, for example.

According to an embodiment of the present invention, the target layer is a stacked structure including a substrate and a material layer disposed on the substrate, for example.

According to an embodiment of the present invention, the material layer includes polysilicon or metal, for example.

According to an embodiment of the present invention, the material layer, the first transfer patterns, the second transfer patterns and the third transfer patterns include the same material or different materials.

According to an embodiment of the present invention, the first transfer patterns, the second transfer patterns and the third transfer patterns each include polysilicon or metal, for example.

According to an embodiment of the present invention, the mask layer includes tetraethyl orthosilicate $SiO_2$ (TEOS-$SiO_2$), borophosphosilicate glass (BPSG), phosphosilicate glass (PSG), hydrogen silsesquioxane (HSQ), fluorosilicate glass (FSG) or undoped silicate glass (USG), for example.

According to an embodiment of the present invention, the first conversion process and the second conversion process each include an oxidation process, a nitridation process, an oxynitridation process or a metal silicidation process, for example.

According to an embodiment of the present invention, the first conversion patterns and the second conversion patterns include the same material or different materials.

According to an embodiment of the present invention, the first conversion patterns and the second conversion patterns each include silicon oxide, silicon nitride, silicon oxynitride, metal oxide, metal nitride, metal oxynitride or metal silicide, for example.

According to an embodiment of the present invention, the step of filling the second transfer patterns in the gaps between the first conversion patterns includes forming a first transfer layer to cover the first conversion patterns, and then removing a portion of the first transfer layer to expose tops of the first conversion patterns.

According to an embodiment of the present invention, the step of removing the portion of the first transfer layer includes performing an etching back process or a CMP process, for example.

According to an embodiment of the present invention, the step of filling the third transfer patterns in the gaps between the second conversion patterns includes forming a second transfer layer to cover the second conversion patterns, and then removing a portion of the second transfer layer to expose tops of the second conversion patterns.

According to an embodiment of the present invention, the step of removing the portion of the second transfer layer includes performing an etching back process or a CMP process, for example.

According to an embodiment of the present invention, the step of removing the first conversion patterns and the step of removing the second conversion patterns each include performing an etching process, for example.

The present invention further provides a patterning method. First, a mask layer and a plurality of first transfer patterns are sequentially formed on a target layer. Thereafter, a plurality of second patterns is formed in the gaps between the first transfer patterns. Afterwards, a plurality of third transfer patterns is formed, wherein each of the third transfer patterns is in a gap between a first transfer pattern and a second transfer pattern. A portion of the mask layer is then removed, using the first transfer patterns, the second transfer patterns and third transfer patterns as a mask, so as to form a patterned mask layer. Further, a portion of the target layer is removed using the patterned mask layer as a mask.

According to an embodiment of the present invention, the target layer is a substrate, for example.

According to an embodiment of the present invention, the target layer is a stacked structure including a substrate and a material layer disposed on the substrate, for example.

According to an embodiment of the present invention, the material layer includes polysilicon or metal, for example.

According to an embodiment of the present invention, the first transfer patterns, the second transfer patterns and the third transfer patterns each include polysilicon or metal, for example.

The present invention further provides an integrated circuit structure including a target layer disposed over a substrate and having a plurality of first patterns, a plurality of second patterns and a plurality of third patterns, wherein each first pattern has a line with of L1, each second pattern has a line width of L2, each third pattern has a line width of L3, and L1, L2 and L3 are different from each other, and one first pattern, one second pattern, one third pattern and one second pattern are arranged repeatedly in a sequence.

According to an embodiment of the present invention, the target layer is a stacked structure including a dielectric layer and a material layer disposed on the substrate, for example.

According to an embodiment of the present invention, the material layer includes polysilicon or metal, for example.

According to an embodiment of the present invention, the dielectric layer includes silicon oxide, for example.

In the present invention, by performing two times of conversion processes and two times of self-aligned processes, the pattern density is increased by 4 times. That is, the quadruple patterning method of the present invention can reduce the pitch to ¼ that of its original length with existing machines and processes, so that the cost is greatly reduced and the competitiveness is significantly improved.

In order to make the aforementioned and other objects, features and advantages of the present invention comprehensible, a preferred embodiment accompanied with figures is described in detail below.

DESCRIPTION OF EMBODIMENTS

FIGS. 1A to 1I are schematic top views illustrating a patterning method according to an embodiment of the present invention FIGS. 2A to 2I are schematic cross-sectional views taken along the line I-I' in FIGS. 1A to 1I.

Figure 1A:
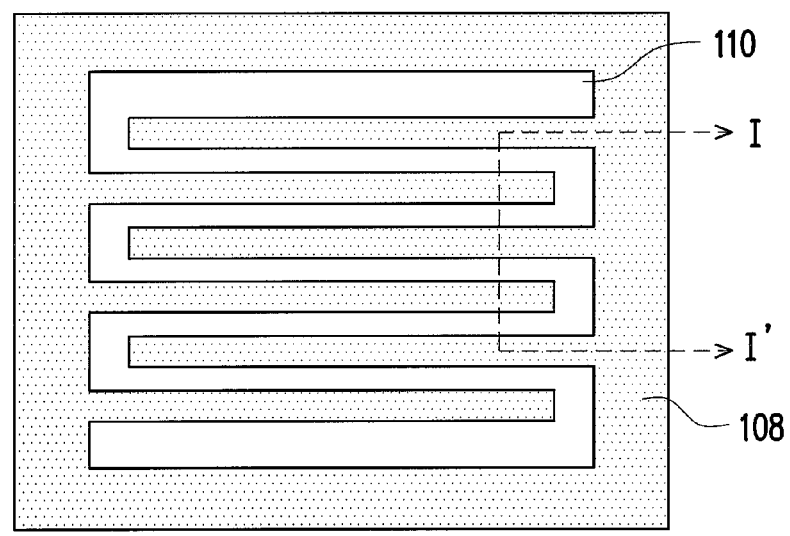
FIGS. 1A to 1I are schematic top views illustrating a patterning method according to an embodiment of the present invention.
Figure 2A:
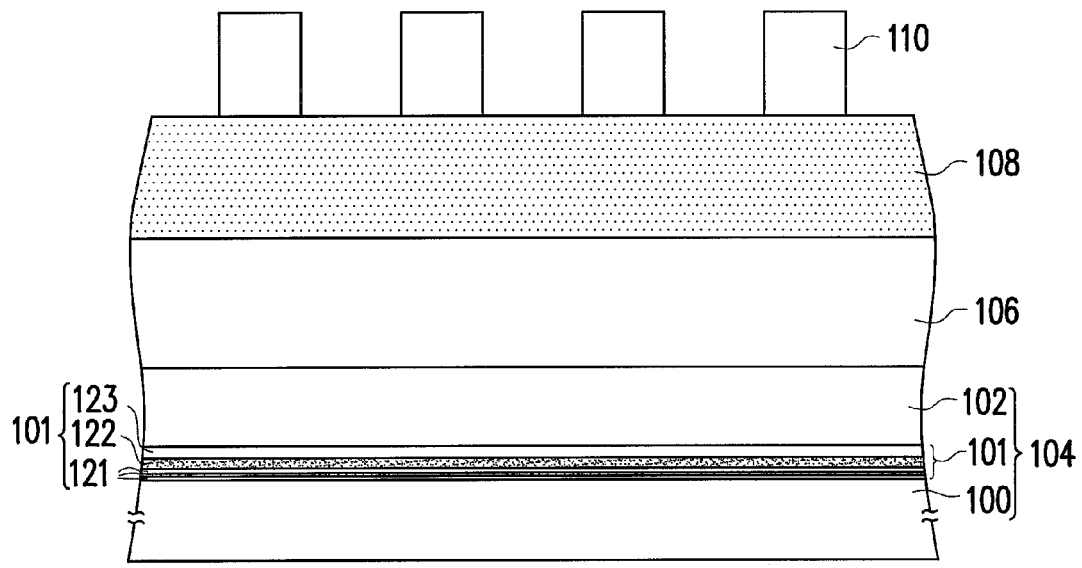
FIGS. 2A to 2I are schematic cross-sectional views taken along the line I-I' in FIGS. 1A to 1I.

Referring to FIGS. 1A and 2A, a mask layer 106, a transfer layer 108 and a patterned photoresist layer 110 are sequentially formed on a target layer 104. The target layer may be a stacked structure including a dielectric layer 101 and a material layer 102 sequentially formed on a substrate 100. The substrate 100 may be semiconductor substrate, such as a silicon substrate. The dielectric layer may be a single-layer or multi-layer structure. The material layer 102 includes polysilicon or metal, for example. The mask layer 106 includes TEOS-$SiO_2$, BPSG, PSG, HSQ, FSG or USG, for example. The transfer layer 108 includes polysilicon or metal, for example. The dielectric layer 101, the material layer 102, the mask layer 106 and the transfer layer 108 are formed by chemical vapor deposition (CVD) processes, for example.

In this embodiment, the dielectric layer 101 is a multi-layer structure of 20 Å thick including an ONO composite layer 121, a charge storage layer 122 and an isolation layer 123 sequentially formed in the substrate 100, for example. The material layer 102 is a polysilicon layer of 100 Å thick, for example. The mask layer 106 is a TEOS-$SiO_2$ layer of 200 Å thick, for example. The transfer layer 108 is another polysilicon layer of 200 Å thick, for example. The patterned photoresist layer 110 has a line/space width of about 100/100 nm, for example.

Figure 1B:
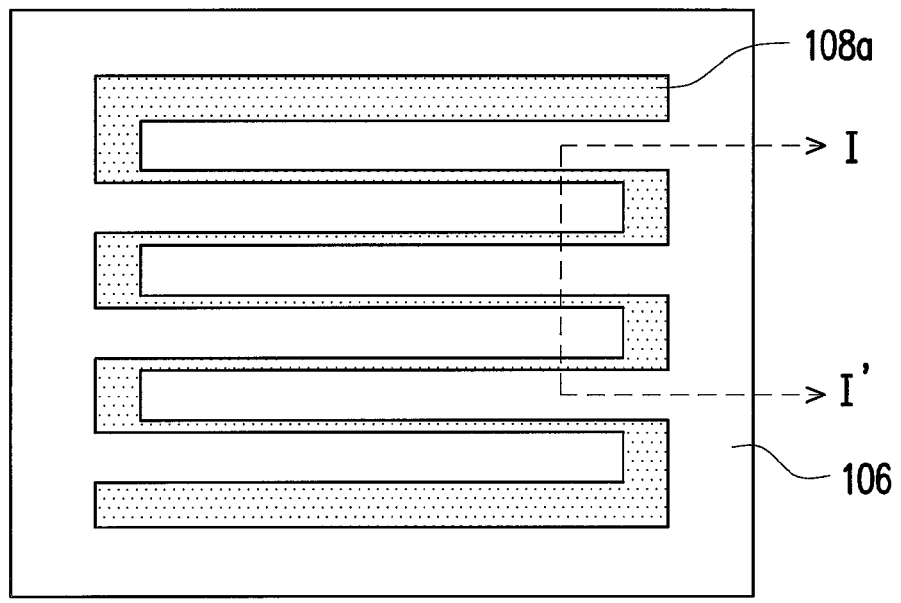
Figure 2B:
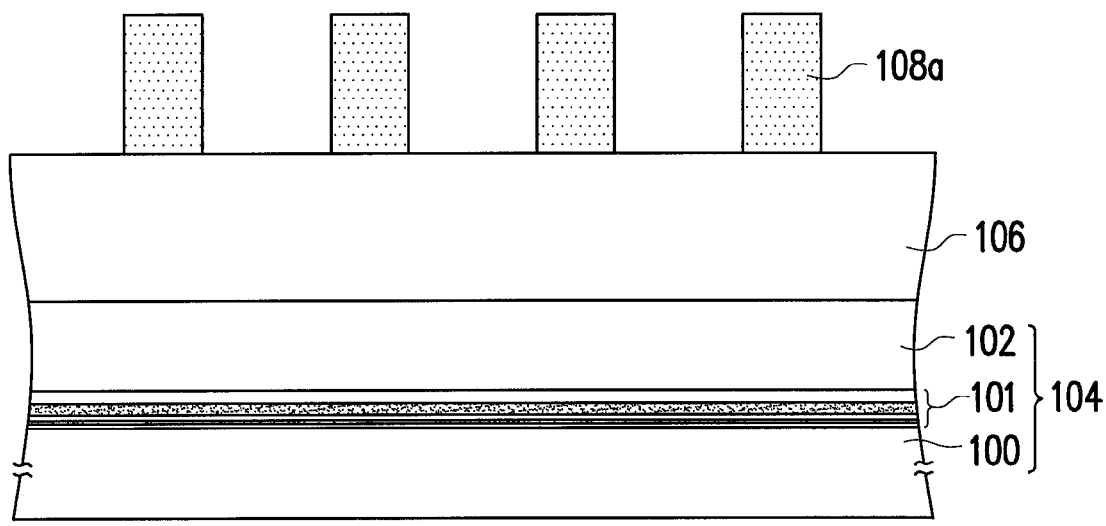

Referring to FIGS. 1B and 2B, a portion of the transfer layer 108 is removed, using the patterned photoresist layer 110 as a mask, so as to form a plurality of transfer patterns 108a. Before the step of removing the portion of the transfer layer 108, a trimming process is performed to the patterned photoresist layer 110, so as to further reduce the line width of the patterned photoresist layer 110. In this embodiment, each of the transfer patterns 108a has a line width of about 70 Å, for example. In FIG. 1B, the transfer patterns 108a are formed in a snake-shape, and the ends thereof are connected to each other. However, the present invention is not limited thereto. In another embodiment (not shown), the ends of the transfer patterns 108a are not connected to each other.

Figure 1C:
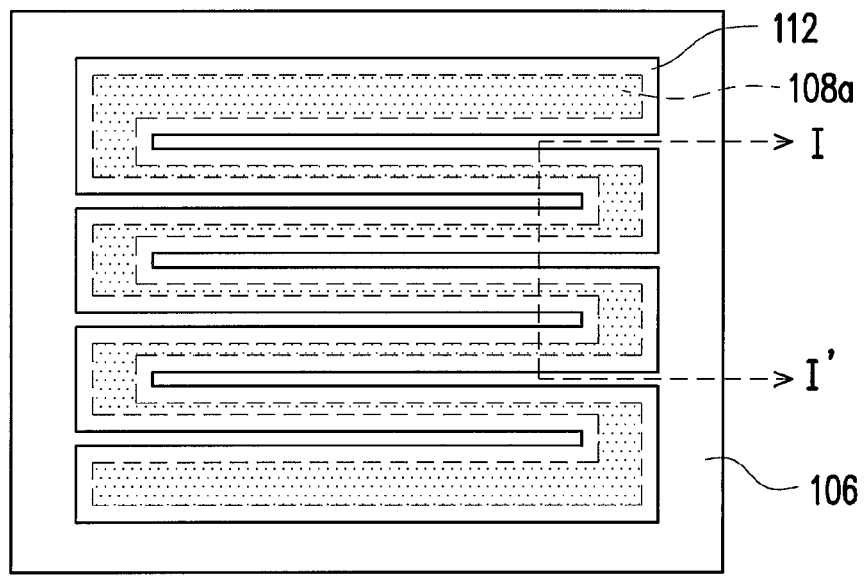
Figure 2C:
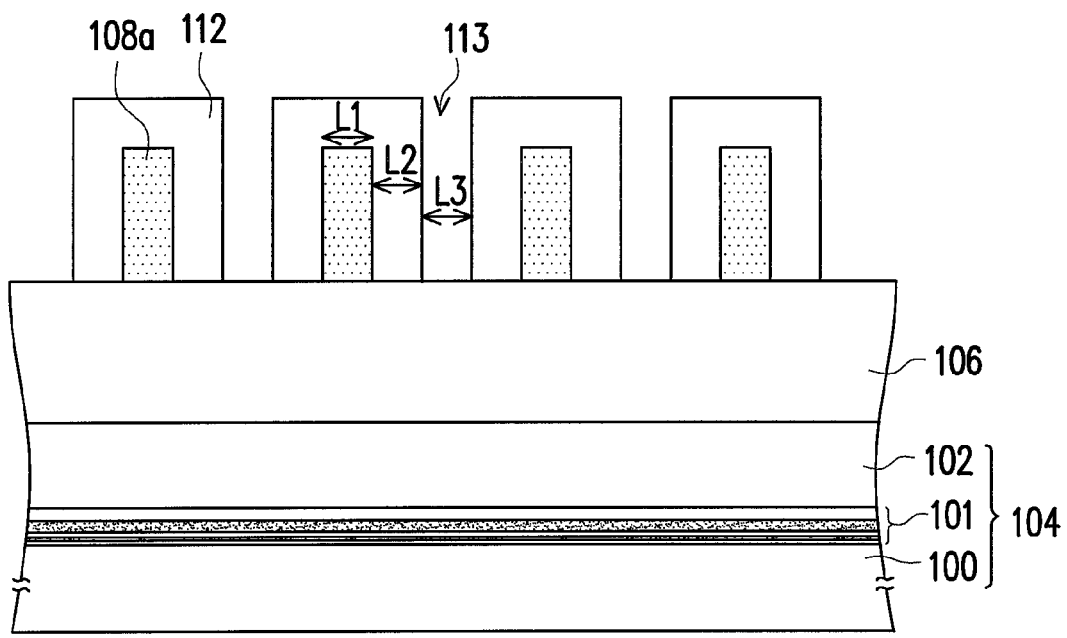

Referring to FIGS. 1C and 2C, a first conversion process is performed to the surfaces of the transfer patterns 108a, so as to form a plurality of conversion patterns 112 on the surfaces of the transfer patterns 108a. The first conversion process includes an oxidation process, a nitridation process, an oxynitridation process or a metal silicidation process, for example. The conversion patterns 112 include silicon oxide, silicon nitride, silicon oxynitride, metal oxide, metal nitride, metal oxynitride or metal silicide, for example. In this embodiment, an oxidation process is performed to the surfaces of the transfer patterns 108a, for example. When the transfer patterns 108a include polysilicon, the conversion patterns 112 include silicon oxide, for example. In this embodiment, the transfer patterns 108a each having a line width L1 of about 50 Å and the conversion patterns 112 each having a line width L2 of about 50 Å are formed by controlling the oxidation rate properly. The width L3 of each gap 113 between the adjacent conversion patterns 112 is about 50 Å. In addition, the first conversion process can also include a CVD process to further adjust the line width of each conversion pattern 112.

Figure 1D:
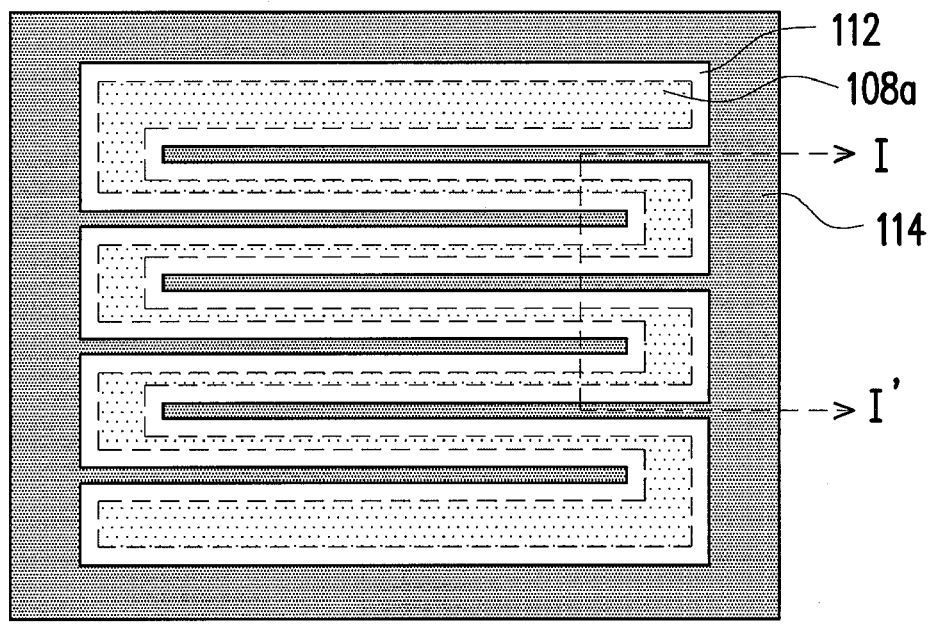
Figure 2D:
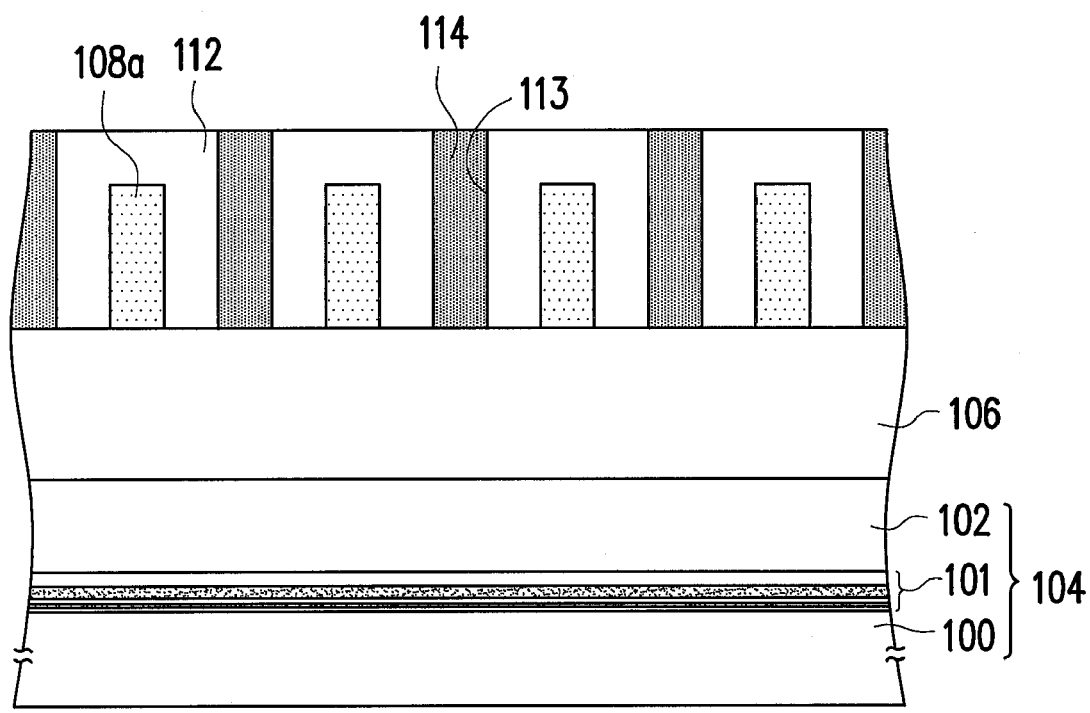

Referring to FIGS. 1D and 2D, a plurality of transfer patterns 114 are filled in the gaps 113 between the conversion patterns 112. The method of filling the transfer patterns 114 includes the following steps. First, a first transfer layer (not shown) is formed on the conversion patterns 112 to cover the tops of the conversion patterns 112 and the gaps 113 between the conversion patterns 112. Thereafter, an etching back process or a CMP process is performed to remove a portion of the first transfer layer to expose the tops of the conversion patterns 112. The first transfer layer includes polysilicon or metal, for example. In this embodiment, the first transfer layer is a polysilicon layer, for example.

Figure 1E:
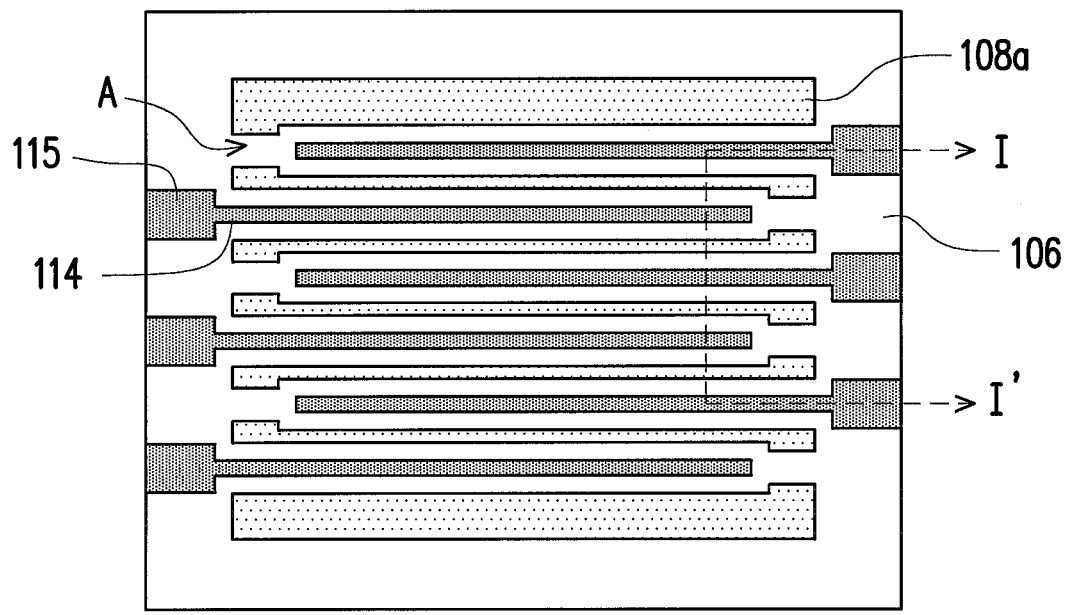
Figure 2E:
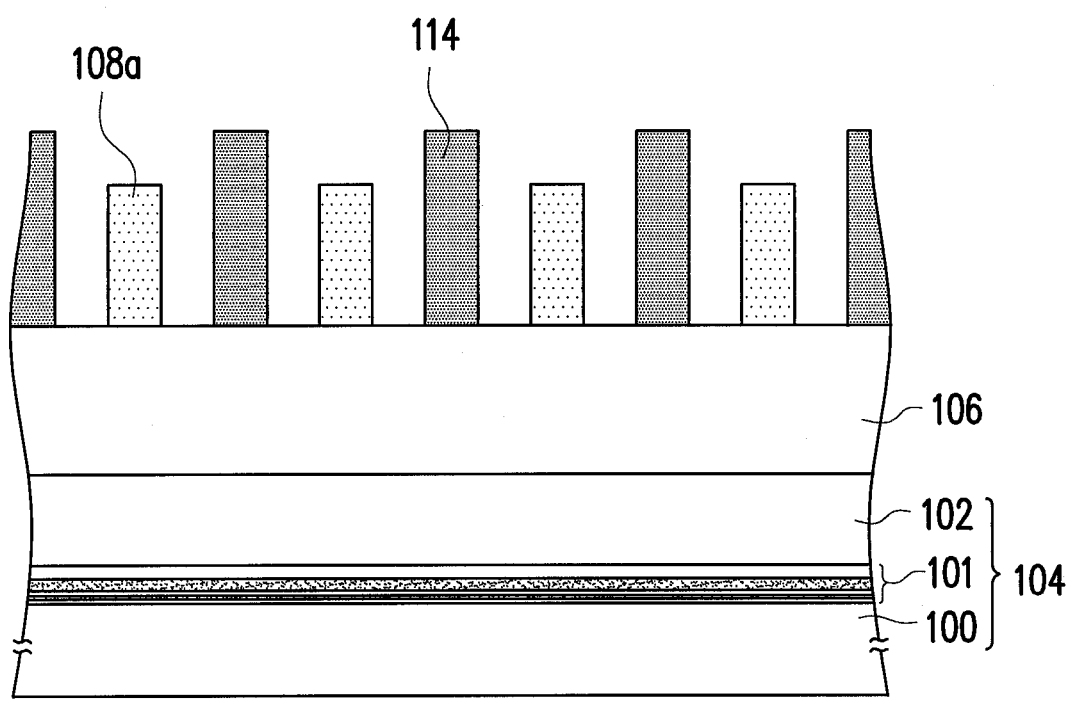

Referring to FIGS. 1E and 2E, a lithography process and an etching process are performed to the transfer patterns 114, so as to define pads 115 of the transfer patterns 114. During the step of defining the pads 115, a portion of the transfer patterns 108a are also removed, as referred to the area A in FIG. 1E. Thereafter, an etching process is performed to remove the conversion patterns 112. Accordingly, the transfer patterns 108a and the transfer patterns 114 are alternately arranged to form an array. In other words, by the self-aligned process as shown in FIGS. 1B to 1E, the transfer patterns 114 are formed in the gaps between the transfer patterns 108a, and the line/space width of the array is about 50/50 nm.

Figure 1F:
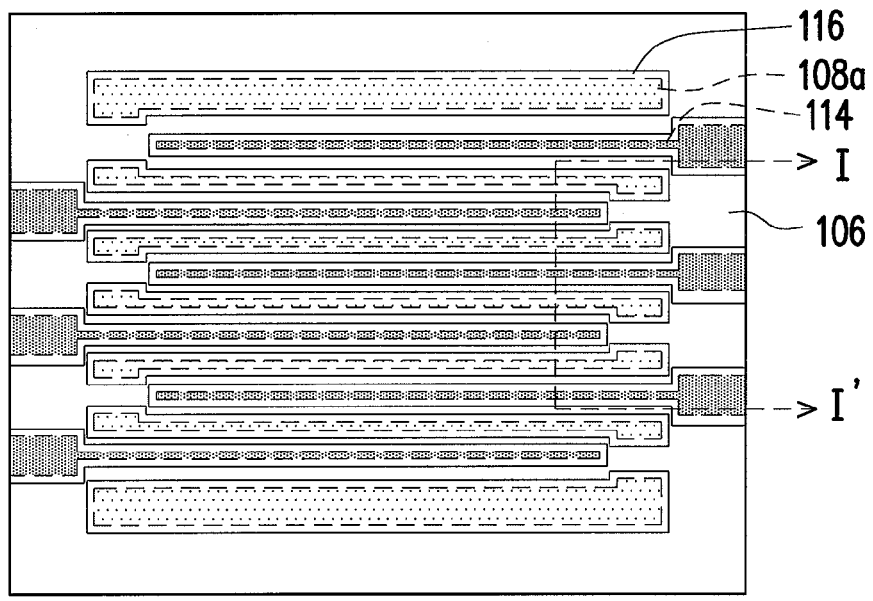
Figure 2F:
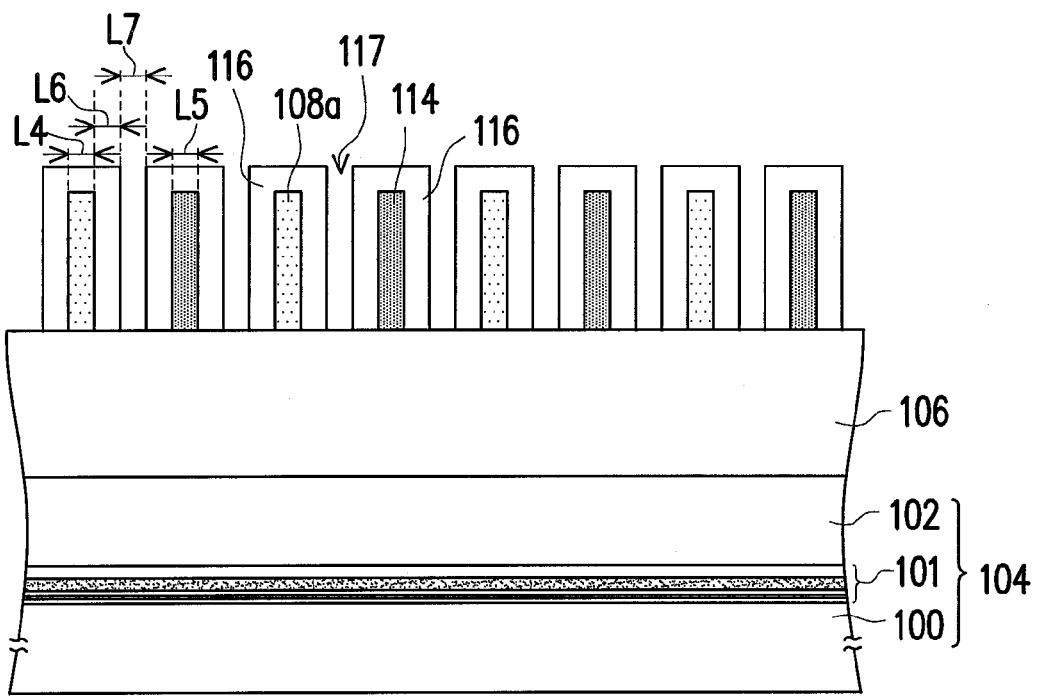

Referring to FIGS. 1F and 2F, a second conversion process is performed to the surfaces of the transfer patterns 108a and transfer patterns 114, so as to form a plurality of conversion patterns 116 on the surfaces of the transfer patterns 108a and the transfer patterns 114. The second conversion process includes an oxidation process, a nitridation process, an oxynitridation process or a metal silicidation process, for example. The conversion patterns 116 include silicon oxide, silicon nitride, silicon oxynitride, metal oxide, metal nitride, metal oxynitride or metal silicide, for example. In this embodiment, an oxidation process is performed to the surfaces of the transfer patterns 108a and the transfer patterns 114, for example. When the transfer patterns 108a and the transfer patterns 114 include polysilicon, the conversion patterns 116 include silicon oxide, for example. In this embodiment, the transfer patterns 108a each having a line width L4 of about 25 Å, the transfer patterns 114 each having a line width L5 of about 25 Å and the conversion patterns 116 each having a line width L6 of about 25 Å are formed by controlling the oxidation rate properly. The width L7 of each gap 117 between the adjacent conversion patterns 116 is about 25 Å. In addition, the second conversion process can also include a CVD process to further adjust the line width of each conversion pattern 116.

Figure 1G:
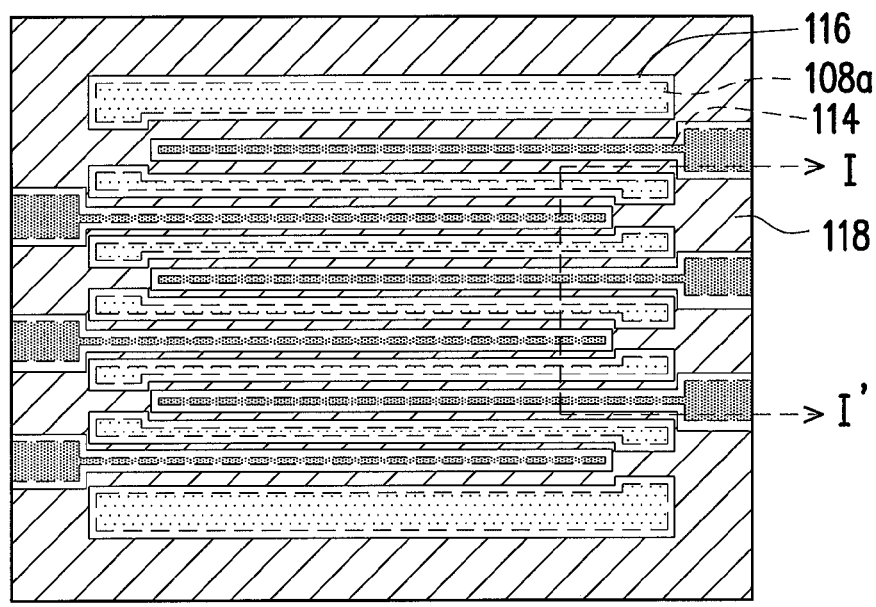
Figure 2G:
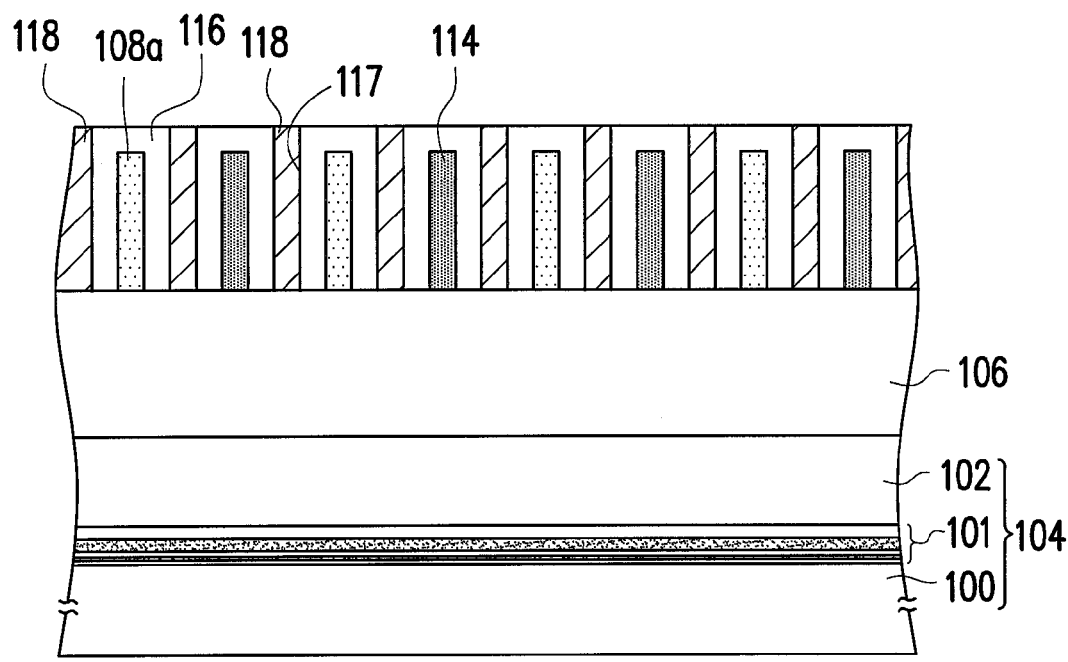

Referring to FIGS. 1G and 2G, a plurality of transfer patterns 118 are filled in the gaps 117 between the conversion patterns 116. The method of filling the transfer patterns 118 includes the following steps. First, a second transfer layer (not shown) is formed on the conversion patterns 116 to cover the tops of the conversion patterns 116 and the gaps 117 between the conversion patterns 116. Thereafter, an etching back process or a CVD process is performed to remove a portion of the second transfer layer to expose the tops of the conversion patterns 116. The second transfer layer includes polysilicon or metal, for example. In this embodiment, the second transfer layer is a polysilicon layer, for example.

Figure 1H:
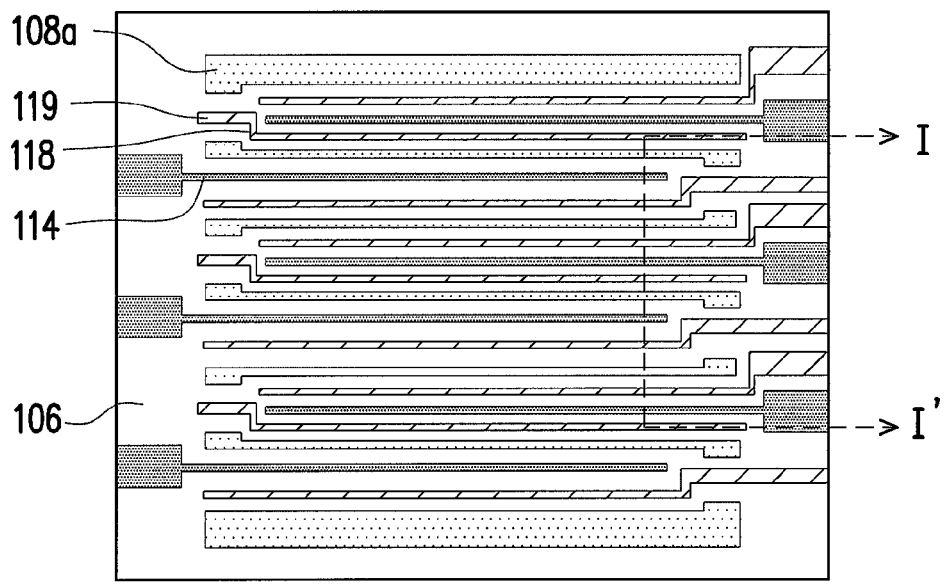
Figure 2H:
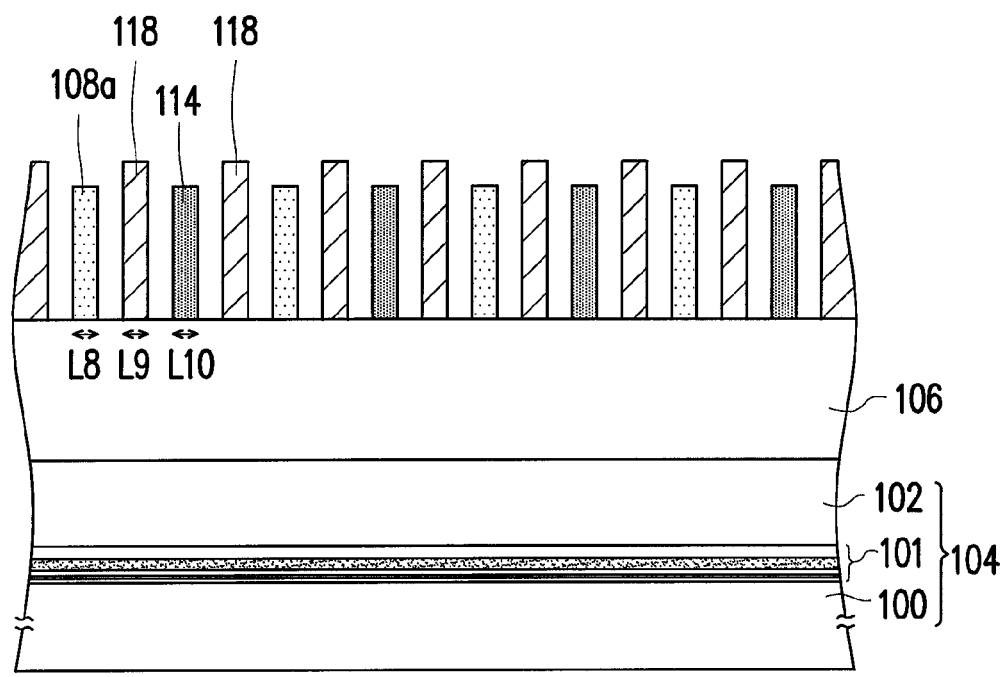

Referring to FIGS. 1H and 2H, a lithography process and an etching process are performed to the transfer patterns 118, so as to define pads 119 of the transfer patterns 118. Thereafter, an etching process is performed to remove the conversion patterns 116. Accordingly, one transfer pattern 108a, one transfer pattern 118, one transfer pattern 114, and one transfer pattern 118 are arranged repeatedly in the sequence to form an array. In other words, by the self-aligned process as shown in FIGS. 1F to 1H, the transfer patterns 118 are formed, each of the transfer patterns 118 is in a gap between a transfer pattern 108a and a transfer pattern 114 adjacent to the transfer pattern 108a, and the line/space width of the array is about 25/25 nm.

Figure 1I:
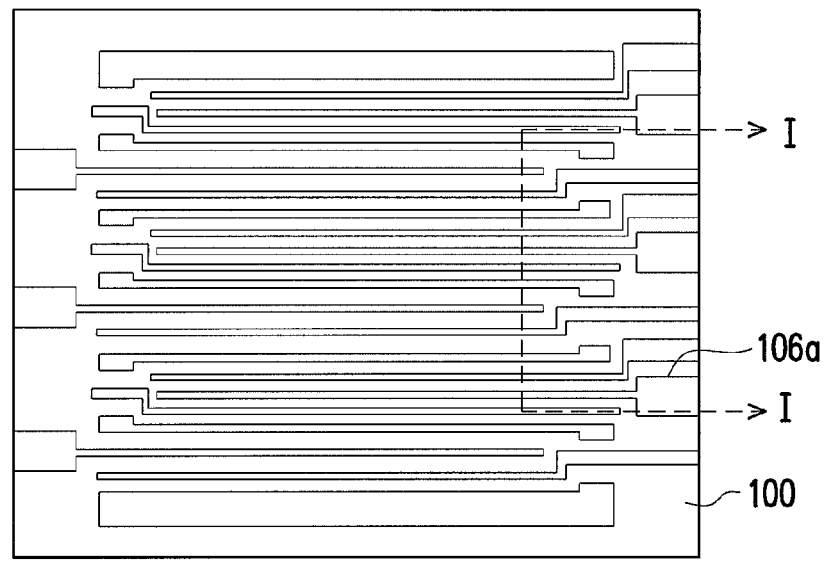
Figure 2I:
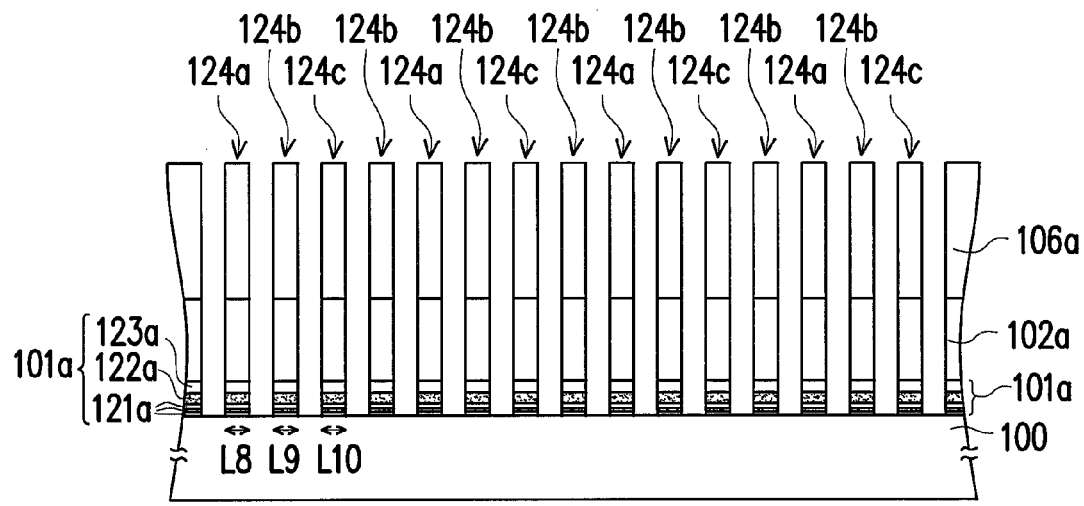

Referring to FIGS. 1I and 2I, a portion of the mask layer 106 is removed, using the transfer patterns 108a, then transfer patterns 114 and the transfer patterns 118 as a mask, so as to form a patterned mask layer 106a. Thereafter, a portion of the target layer 104 is removed, using the patterned mask layer 106a as a mask, so as to form a patterned material layer 102a and a patterned dielectric layer 101a. The patterned dielectric layer 101a includes a patterned ONO composite layer 121a, a patterned charge storage layer 122a and a patterned isolation layer 123a.

In the above-mentioned embodiment, each of the transfer patterns 108a, the transfer patterns 118 and the transfer patterns 114 has substantially the same line width, but may be different from each other due to manufacture process variation. Each transfer pattern 108a has a line width of L8, each transfer pattern 118 has a line width of L9, each transfer pattern 114 has a line width of L10, and L8, L9 and L10 are different from each other. As shown in FIGS. 2H and 2I, each transfer pattern 108a defines a first pattern 124a, each transfer pattern 118 defines a second pattern 124b, and each transfer pattern 114 defines a third pattern 124c. Thus, one first pattern 124a, one second pattern 124b, one third pattern 124c, and one second pattern 124b are arranged repeatedly in the sequence.

The above-mentioned embodiment in which the target layer 104 is a stacked structure including a dielectric layer 101 and a material layer 102 for forming gates or word lines of the non-volatile memory is provided for illustration purposes, and is not to be construed as limiting the present invention. In another embodiment (not shown), the target layer can be a single-layer structure formed by a substrate only, and thus, the patterning method of the present invention can be applied to form shallow trench isolation (STI) structures in the substrate.

Further, the present invention is illustrated with the above-mentioned embodiment in which the material layer 102, the transfer patterns 108a, the transfer patterns 114 and the transfer patterns 118 include the same material such as polysilicon. However, the present invention is not limited thereto. In another embodiment, the material layer 102, the transfer patterns 108a, the transfer patterns 114 and the transfer patterns 118 can include different materials. For example, the material layer 102 includes metal, and the transfer patterns 108a, the transfer patterns 114 and the transfer patterns 118 include polysilicon; or the material layer 102 includes polysilicon, and the transfer patterns 108a, the transfer patterns 114 and the transfer patterns 118 include metal; or the material layer 102 and the transfer patterns 114 include polysilicon, and the transfer patterns 108a and the transfer patterns 118 include metal and so on. Moreover, the first conversion process and the second conversion process can be the same or different. For example, the first conversion process is an oxidation process and the second conversion process is a nitridation process. That is, the conversion patterns 112 and the conversion patterns 116 can be the same or different. Accordingly, the persons skilled in the art can adjust the materials of the material layer 102, the transfer patterns 108a, the transfer patterns 114, the transfer patterns 118, the conversion patterns 112 and the conversion patterns 116 upon the process requirement as needed, and the detail of the material combination is not iterated herein.

In summary, by performing two times of conversion processes and two times of self-aligned processes, a transfer pattern 108a is formed in a gap between two adjacent transfer patterns 114, and a transfer pattern 118 is then formed in a gap between a transfer pattern 108a and a transfer pattern 114 adjacent to the transfer pattern 108a. Thus, the pattern density is increased by 4 times, and the pitch is reduced to ¼ that of its original length. In other words, the quadruple patterning method of the present invention can reduce the pitch to ¼ that of its original length with existing machines and processes.

For example, the lithography resolution of current 193 nm ArF laser is about 40 nm. The patterning method of the present invention can increase the defined pattern density by 4 times and reduce the pitch to ¼ that of its original length, and thus, a line/space width of no more than 25/25 nm, or even 10/10 nm, is feasible. The patterning method of the present invention can reduce the pitch to ¼ that of its original length without replacing existing machines and photoresists, so that the cost is greatly reduced and the competitiveness is significantly improved.

Further, in the patterning method of the present invention, the overlay specifications of defining the pads 115 and 119 are less critical than those of defining critical dimensions, so that the process window is wider.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A patterning method, comprising:
    forming a mask layer and a plurality of first transfer patterns sequentially on a target layer;
    performing a first conversion process to consume surfaces of the first transfer patterns, so as to form a plurality of first conversion patterns on the surfaces of the first transfer patterns;
    filling a plurality of second transfer patterns in gaps between the first conversion patterns;
    removing the first conversion patterns;
    performing a second conversion process to consume surfaces of the first transfer patterns and the second transfer patterns, so as to form a plurality of second conversion patterns on the surfaces of the first transfer patterns and the second transfer patterns;
    filling a plurality of third transfer patterns in gaps between the second conversion patterns;
    removing the second conversion patterns;
    removing a portion of the mask layer, using the first transfer patterns, the second transfer patterns and the third transfer patterns as a mask, so as to form a patterned mask layer; and
    removing a portion of the target layer using the patterned mask layer as a mask.

2. The patterning method of claim 1, wherein the target layer is a substrate.

3. The patterning method of claim 1, wherein the target layer is a stacked structure comprising a substrate and a material layer disposed on the substrate.

4. The patterning method of claim 3, wherein the material layer comprises polysilicon or metal.

5. The patterning method of claim 3, wherein the material layer, the first transfer patterns, the second transfer patterns and the third transfer patterns comprise the same material or different materials.

6. The patterning method of claim 1, wherein the first transfer patterns, the second transfer patterns and the third transfer patterns each comprise polysilicon or metal.

7. The patterning method of claim 1, wherein the mask layer comprises TEOS-$SiO_2$, BPSG, PSG, HSQ, FSG or USG.

8. The patterning method of claim 1, wherein the first conversion process and the second conversion process each comprise an oxidation process, a nitridation process, an oxynitridation process or a metal silicidation process.

9. The patterning method of claim 1, wherein the first conversion patterns and the second conversion patterns comprise the same material or different materials.

10. The patterning method of claim 1, wherein the first conversion patterns and the second conversion patterns each comprise silicon oxide, silicon nitride, silicon oxynitride, metal oxide, metal nitride, metal oxynitride or metal silicide.

11. The patterning method of claim 1, wherein the step of filling the second transfer patterns in the gaps between the first conversion patterns comprises:
    forming a first transfer layer to cover the first conversion patterns; and
    removing a portion of the first transfer layer to expose tops of the first conversion patterns.

12. The patterning method of claim 11, wherein the step of removing the portion of the first transfer layer comprises performing an etching back process or a CMP process.

13. The patterning method of claim 1, wherein the step of filling the third transfer patterns in the gaps between the second conversion patterns comprises:
    forming a second transfer layer to cover the second conversion patterns; and
    removing a portion of the second transfer layer to expose tops of the second conversion patterns.

14. The patterning method of claim 13, wherein the step of removing the portion of the second transfer layer comprises performing an etching back process or a CMP process.

15. The patterning method of claim 1, wherein the step of removing the first conversion patterns and the step of removing the second conversion patterns each comprise performing an etching process.

16. A patterning method, comprising:
    forming a mask layer and a plurality of first transfer patterns sequentially on a target layer;
    forming a plurality of second transfer patterns in gaps between the first transfer patterns;
    forming a plurality of third transfer patterns, each of which is in a gap between a first transfer pattern and a second transfer pattern,;
    removing a portion of the mask layer, using the first transfer patterns, the second transfer patterns and the third transfer patterns as a mask, wherein each of the second transfer patterns is located between two third transfer patterns, so as to form a patterned mask layer; and
    removing a portion of the target layer using the patterned mask layer as a mask.

17. The patterning method of claim 16, wherein the target layer is a substrate.

18. The patterning method of claim 16, wherein the target layer is a stacked structure comprising a substrate and a material layer disposed on the substrate.

19. The patterning method of claim 18, wherein the material layer comprises polysilicon or metal.

20. The patterning method of claim 16, wherein the first transfer patterns, the second transfer patterns and the third transfer patterns each comprise polysilicon or metal.

* * * * *